United States Patent [19]

Boos et al.

[11] Patent Number: 5,015,603
[45] Date of Patent: May 14, 1991

[54] TIW DIFFUSION BARRIER FOR AUZN OHMIC CONTACT TO P-TYPE INP

[75] Inventors: John B. Boos, Springfield, Va.; Nicolas A. Papanicolaou, Silver Spring, Md.; Tung H. Weng, Rochester, Mich.

[73] Assignee: The United States of America as represented by the Secretary of the Navy, Washington, D.C.

[21] Appl. No.: 291,479

[22] Filed: Dec. 28, 1988

Related U.S. Application Data

[60] Division of Ser. No. 208,444, Jun. 17, 1988, Pat. No. 4,816,881, which is a continuation of Ser. No. 749,238, Jun. 27, 1985, abandoned.

[51] Int. Cl.$^5$ ............................................. H01L 29/80
[52] U.S. Cl. ..................................................... 437/184
[58] Field of Search ........................................ 437/184

[56] References Cited

U.S. PATENT DOCUMENTS

| | | |
|---|---|---|
| 4,359,485 | 11/1982 | Donnelly et al. ................... 437/184 |
| 4,366,186 | 12/1982 | Keramidas et al. ................. 437/184 |
| 4,471,005 | 9/1984 | Cheng et al. ....................... 437/184 |

FOREIGN PATENT DOCUMENTS 54-42975  4/1979  Japan .

OTHER PUBLICATIONS

Yamashita et al., J. Appl. Phys. 52 (12), Dec. 1961 pp. 7304–7306.

J. B. Boos et al. "Fully Ion Implanted InP Junction FET's", IEEE Electron Device Letters, vol. EDL-3, No. 9, Sep. 1982, pp. 256-258.

Tatsuyuki Sanaga et al. "Ohmic Contacts to p-GaAs with Au/Zn/Au Structure", Japanese Journal of Applied Physics, vol. 19, No. 8 Aug. 1980, pp. L491-L494.

F. A. Thiel et al., "Contacts to p-Type InP," J. Electrochem, Soc.: Solid-State Science and Technology, vol. 124, No. 2, Feb. 1977, pp. 317-318.

E. Kuphal, "Low Resistance Ohmic Contacts to n- And P-InP", Solid State Electronics, vol. 24, (1980), pp. 69-79.

"Low-Resistance Ohmic Contacts to p-InP" Electronics Letters, vol. 18, No. 17, Aug. 19, 1982, pp. 755-756.

Primary Examiner—Olik Chaudhuri
Assistant Examiner—Andrew Griffis
Attorney, Agent, or Firm—Thomas E. McDonnell; Barry A. Edelberg

[57] ABSTRACT

A low metal resistance ohmic contact alloyed to p InP material having TiW within the contact as a diffusion barrier layer between an underlay of AuZn and an overlay of Au. A process for fabricating an InP JFET containing a gate contact of respective AuZn, TiW, and Au layers and with the gate contact alloyed to p InP material of a semiconductive gate region provides an improved InP JFET having a low resistance metal alloyed ohmic contact to the gate region. Use of the TiW layer in a multilayer contact alloyed to P InP material leads to unique processing and improved InP semiconductor devices.

3 Claims, 4 Drawing Sheets

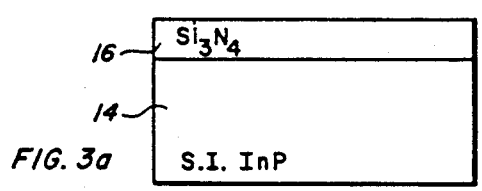
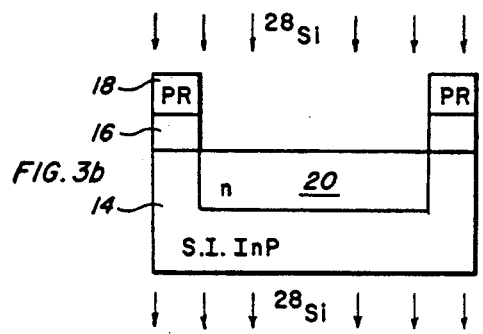
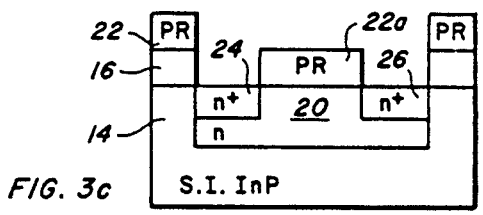
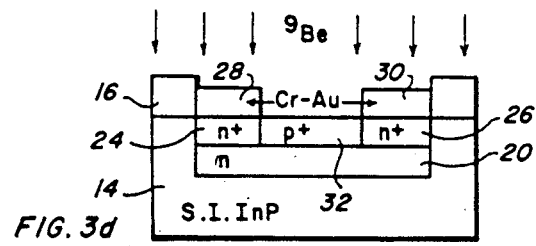
FIG. 3e  STRIP METAL AND NITRIDE ETCH REGISTER PROXIMITY ANNEAL
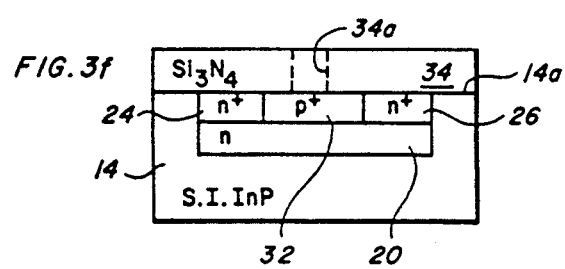
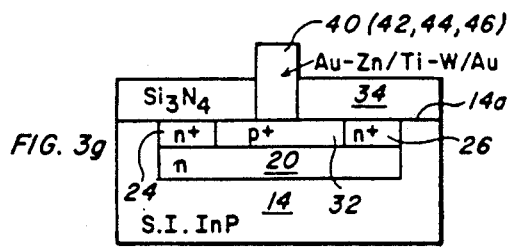
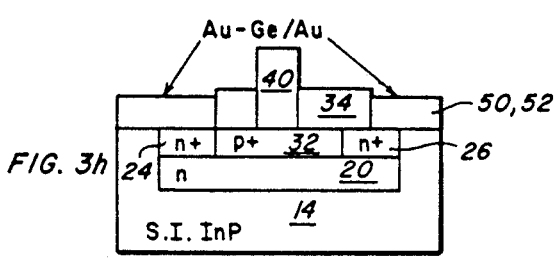
FIG. 3i  ALLOY SAMPLE
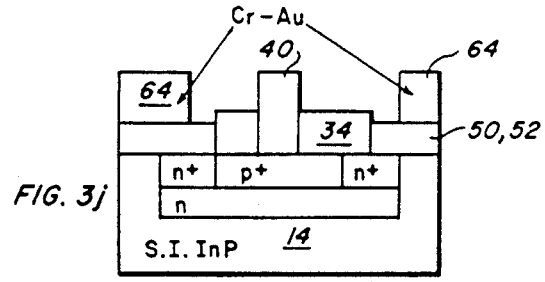
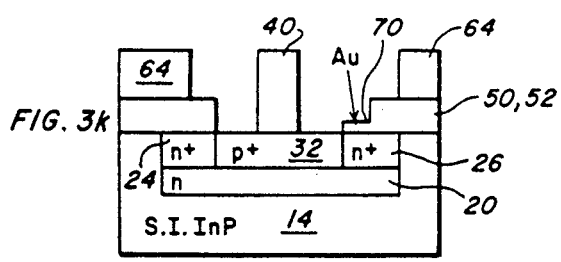
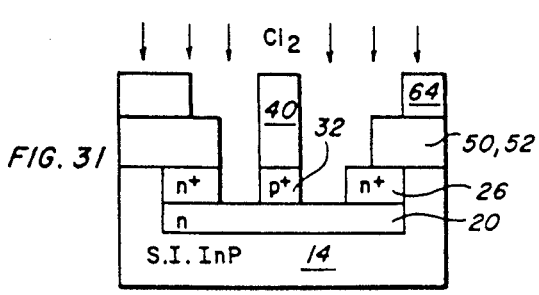

TIW DIFFUSION BARRIER FOR AUZN OHMIC CONTACT TO P-TYPE INP

This is a divisional of co-pending application Ser. No. 07/208,444 filed on June 17, 1988 now U.S. Pat. No. 4,816,881 which was a continuation application of a parent application Ser. No. 06/749,238 filed June 27, 1985, now abandoned.

BACKGROUND OF THE INVENTION

This invention relates to a layer of titanium-tungsten (TiW) used as a diffusion barrier in a low metal resistance ohmic contact alloyed to p type indium phosphide (p InP) semiconductor material.

This invention relates more particularly to the fabrication of a low metal resistance ohmic contact through the use of TiW as a diffusion barrier layer between an underlay of AnZn contact layer alloyed to p InP and an overlay of suitable metal, especially Au.

This invention relates in particular to a layer of TiW used as a diffusion barrier in a AuZn/TiW/Au layered ohmic contact alloyed to p InP material of a semiconductor device, and especially relates to the same where the ohmic contact serves as the gate contact of an InP junction field effect transistor (JFET) having gate, source, channel and drain regions and ohmic contacts to the gate, source and drain.

This invention relates more particularly to a technique that prevents degradation of the gate metal resistance of an ohmic gate contact of an InP junction FET.

Prior art pertinent to the present invention is set forth in an article entitled, "Low-Resistance Ohmic Contacts to p InP," by C. L. Cheng et al., appearing in Electronics Letters, Vol. 18, No. 17, Aug. 1982. This article, however, does not teach that TiW material can be used as a diffusion barrier layer in an ohmic contact to p InP.

Parasitic gate metal resistance plays a major role in determining the ultimate performance characteristics of microwave FETs. Junction FET structures are especially sensitive to gate resistance since (1) there is an additional p-type ohmic contact resistance not present in conventional MESFET structures and (2) the gate metal resistance itself generally increases to several time its bulk value (prior to alloying) as a result of the high temperature alloy process needed and used to form the associated p-type ohmic contact.

The metallization sequence which is commonly used for the formation of the p+ ohmic contact to the p+n junction gate of an InP JFET is evaporated AuZn (90%:10% by weight) with an overlayer of evaporated Au. To obtain a low ohmic gate metal resistance, this two layer metallization must subsequently be alloyed at a temperature above 400° C. The Au gate metal overlayer resistivity in respective test samples has been observed to increase by at least 180% and as much as 450% as a result of this alloying cycle. The outdiffusion of Zn and/or In and P into the Au overlayer is suspect as the cause for this phenomena.

To minimize gate metal resistivity increases with alloying we use a sputtered TiW layer between the AuZn and Au layers as a diffusion barrier to Zn, In and P outdiffusion.

SUMMARY OF THE INVENTION

This invention provides a process for fabricating an ohmic contact alloyed to subjacent p InP material, a process for fabricating the same in an InP semiconductor device, and, most importantly, a process for fabricating the same in an InP JFET using the contact as a gate contact possessing low metal resistance. An improved ohmic contact to p InP material in an InP JFET device is fabricated using a process sequence culminating in alloying of the contact to an underlay of p InP. TiW material in the alloyed contact helps maintain low gate metal resistance.

The new (gate) contact fabrication process can be summarized as follows: First, an AuZn layer is deposited on a prepared p InP surface by co-evaporation of Au and Zn from separate filaments. The composition of the AuZn layer is approximately 90% to 10% by weight as determined by EDAX analysis. Next, a 500A TiW layer is sputtered onto the AuZn layer followed by a thick layer of vaporated gold metal. The multilayer contact is them alloyed to the p InP surface.

Auger electron spectroscopy (AES) analysis performed on samples with and without TiW, before and after contact alloying (at 420° C. for one minute) show that comparison samples without TiW suffer substantial Zn migration into the outer Au layer. In and P are also present in lower concentrations throughout the outer Au layer. Alloyed samples with TiW revealed high concentrations of Zn at the InP/contact interface with no diffusion of Zn, P or In into the Au overlayer. The TiW layer is effective in maintaining the metal resistivity after alloying. Average resistivity increases of 15% with the TiW layer are observed and compared with 180% increases without the TiW layer after alloying.

We have found that the use of a TiW contact layer can effectively maintain a low (gate) contact resistance after alloying. The addition of the TiW layer is easily integrated into the usual InP JFET process sequence. InP JFETs fabricated using the new triple layer gate metallization find application in power FET technology or in the monolithic integration of JFETs and optical devices in the field of optoelectronics. The AuZn-/TiW/Au contact may also impact other device structures such as discrete InP-based optoelectronic devices and InGaAs JFETs, where AuZn P-type ohmic contacts are presently being implemented.

The gate metal resistance of the largest gate contact dimension indeed plays a major role in determining the ultimate performance characteristics of microwave FETs. The metal resistance of a gold-zinc gold (AuZn-Au) gate contact to p InP in earlier studies was found to increase substantially as a result of Zn migration into the outer Au film after alloying. In accordance with our invention, a sputtered titanium-tungsten (TiW) layer deposited between the AuZn and the Au layers acts as a barrier to the Zn out diffusion.

BRIEF DESCRIPTION OF THE DRAWINGS

FIGS. 3a through 3l depict an InP JFET fabrication sequence.

DETAILED DESCRIPTION

Figure 2:
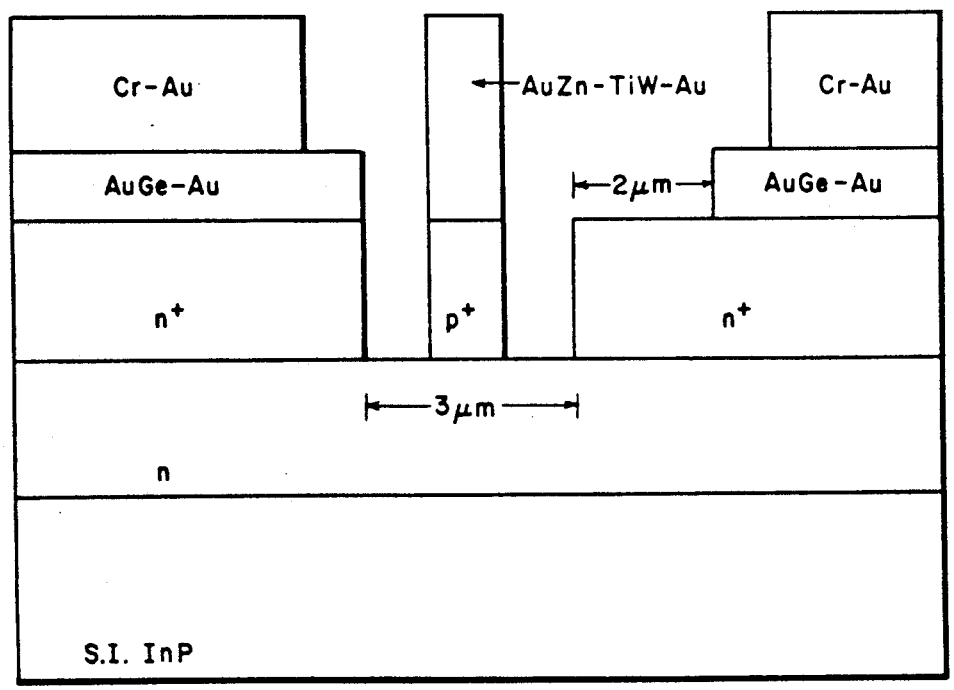
FIG. 2 is a cross sectional view of the source to drain channel of an InP JFET fabricated to include a gate contact constructed in accordance with the present invention.
Figure 7:
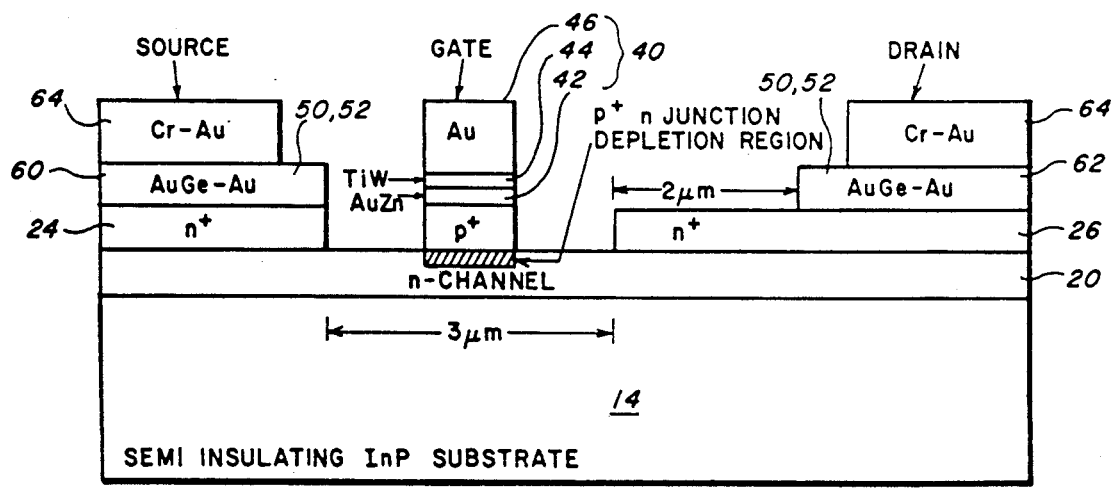
FIG. 7 best illustrates an InP JFET structure incorporating an alloyed contact containing TiW: material to preserve, as much as possible, low metal resistance

FIGS. 2 and 7 illustrate salient features of an improved (gate) contact containing TiW to preserve, as much as possible, a low (gate) metal resistance to p InP material.

Figure 1:
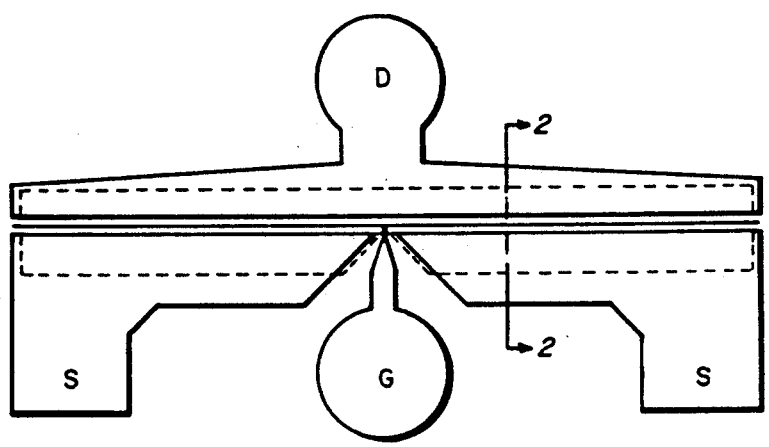
FIG. 1 is a plan view of metallic contacts on top of an Indium Phosphide (InP) junction field effect transistor (JFET) of known configuration used to illustrate a preferred embodiment of the present invention.

The FIG. 7 device includes a gate, a source, a channel and a drain, and respective contacts G, S and D to the gate, source and drain as depicted in FIG. 1.

FIGS. 3a through 3l serve to illustrate the manner whereby a sequence of steps used to provide an improved low gate metal resistance ohmic contact to p InP material is incorporated into a fabrication procedure producing an InP JFET.

FABRICATION PROCESS

Initially, a polished [100] Fe-doped InP LEC semi-insulating substrate 14, coated with a silicon nitride ($Si_3N_4$) layer 16 is provided as shown in FIG. 3a.

To begin the procedure, a polished substrate 14 is cleaned with organic solvents and etched in a 1:4 $H/O_3$-$H_2O$ solution. A 7000-A $Si_3N_4$ layer 16 is grown by plasma-enhanced chemical vapor deposition. The FIG. 3a structure results.

Next, a patterned photoresist layer 18 is formed on the nitride layer 16. A rectangular "n-channel" aperture pattern formed in the photoresist overlays a corresponding surface area on the nitride layer 16. This portion of nitride layer 16 in registry with the photoresist aperture is completely removed by means of $SiF_4$-2 percent $O_2$ plasma etching to obtain the FIG. 3b structure. Thus, a generally rectangular aperture (not numbered) is formed in nitride layer 16.

FIG. 3b shows the resulting structure during the next fabrication step. Using the patterned photoresist layer 18 as an ion implantation mask an n region 20 is formed by two-step energy implantation of $^{28}Si$ (580 kev/$9.4 \times 10^{12} cm^{-2}$).

The patterned photoresist layer 18 is next removed leaving behind the apertured nitride layer 16 over n region 20 in substrate 14.

Using the previously etched nitride layer 16 for process registration, a "source-drain" implantation pattern is delineated in a new photoresist mask 22 freshly formed on the pocketed substrate surface, as shown in FIG. 3c. By ion implantation an n+ source region 24 and an n+ drain region 26 are simultaneously formed in the n InP under respective apertures of the photoresist mask, using a two-step high dose selective $^{28}Si$ implant (280 KeV/$5 \times 10^{13} cm^2$, 30 KeV/$2.5 \times 10^{13} cm^{-2}$) as indicated. Regions 24 and 26 are spaced apart a suitable distance, typically 3 microns, since a photoresist island 22a (3 microns wide) intermediate the laterally-spaced nInP surface areas masks the substrate surface.

With the double-apertured photoresist mask still in place over the InP surface containing source and drain regions 24 and 26 and channel 20, Cr-Au metallization is deposited on top of the entire structure to cover all of the photoresist and two laterally separated exposed surface areas areawise coextensive with regions 24 and 26. Next, the photoresist and much of the Cr-Au metallization is removed via conventional procedures, thereby leaving behind a pair of Cr-Au metallizations 28 and 30 in intimate contact with regions 24 and 26 as shown in FIG. 3d. The Cr-Au metallizations temporarily serve as a $^9Be$ implantation mask in the next fabrication step, as shown in FIG. 3d. All photoresist is removed from the top surface of the structure. Thus, a substrate surface area (not numbered) between the Cr-Au areas is left uncovered on the masked substrate surface so that ion implantation can be performed.

Next, a shallow p+ layer 32 approximately 4000 A thick (shown in FIG. 3d) is formed by implantation of $^9Be$ (30 KeV, $6 \times 10^{13} cm^{-2}$) through the open space between the two metallized areas into a central substrate surface region to produce a structure shown in FIG. 3d.

At this process juncture, all of the essential regions (20, 24, 26 and 32) of an InP JFET have been formed.

Next the Cr-Au metallization areas 28, 30 are removed followed by the removal of the patterned nitride layer 16 prior to performing a step of proximity annealing the resultant partial device structure.

Preliminary registration for post-anneal metal depositions is now accomplished by etching the bare substrate surface in $HIO_3:H_2O$. As a result of differences in surface morphology, n+ registration for subsequent steps becomes clearly visible after removal of approximately 200 A of etched material from the InP substrate surface.

Figure 4:
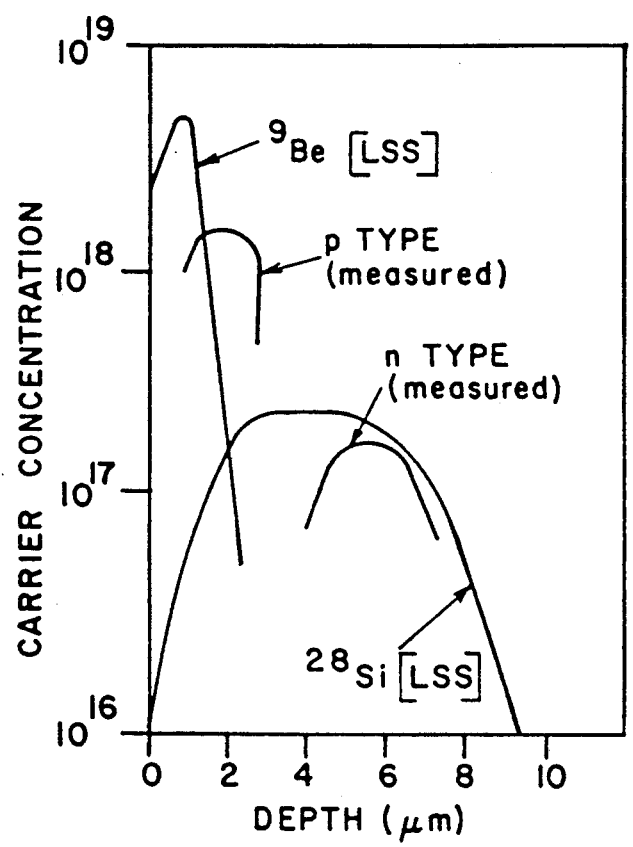
FIG. 4 shows a carrier concentration profile resulting from Silicon (Si) and Beryllium (Be) implantation in semi-insulating InP. The Si and Be LSS distributions are also shown.

Next, the implants of $^{28}Si$ and $^9Be$ in regions 20, 24, 26, and 32 are activated by conventional proximity annealing at 700° C. for 15 minutes. Proximity annealing fixes a desired concentration profile of the earlier implanted $^{28}Si$ and $^9Be$ ions The resulting p-n layer profile in the InP JFET structure is shown in FIG. 4, accompanied with LSS theoretical implant distributions.

The foregoing process steps culminate with the proximity anneal step to produce a contactless InP JFET structure.

The aforesaid strip metal, etch register, and proximity anneal steps are schematically represented by FIG. 3e.

After the annealing has been completed as aforesaid, a 5000 A thick silicon nitride layer 34 (shown in FIG. 3f) is grown on the top InP substrate surface. Layer 34 will later assist in subsequent liftoff of gate, source, and drain contact metallizations that will next be provided.

FIG. 3f shows the composite InP JFET structure just prior to these sequence steps that will produce the novel gate contact and the source and drain contacts.

CONTACT FORMATION

Next, a 1 micron by 260 micron aperture (not shown) is etched through nitride layer 34a. Dotted lines 34a shown in FIG. 3f indicate the spot where the nitride is etched away and entirely removed to form an layer aperture to thus expose subjacent p InP surface material to which ohmic contact must be made.

An InP surface 14a coated with an apertured nitride layer 34 and containing a central p InP surface portion 32a in registry with such layer aperture is thus provided. The unique gate contact fabrication procedure cap now be performed beginning with successive metallization steps.

Next, a 1.0 micron by 300 micron AuZn/TiW/Au gate contact metallization structure 40 shown in FIG. 3g is formed upon p+ InP material. Contact structure 40 as depicted on FIG. 7 is comprised of an AuZn layer 42 contiguous to the p+ InP material, a TiW layer 44 contiguous to the AuZn layer 42, and an Au overlayer 46 contiguous to the TiW layer 44. Multilayer contact 40 is thus formed within the aforesaid nitride mask aperture 34a in FIG. 3g on the subjacent surface portion of the device p+ region 32. AuZn layer 42 typically is 200-A thick. AuZn layer 42 is formed by simultaneously evaporating Au and Zn from separate filaments. Intermediate TiW layer 44 typically is 500-A thick and is sputtered onto AuZn layer 42. Au layer 46 is 10,000 A thick and is evaporated onto TiW layer 50. Typically the Au layer is 10,000 A.

The TiW layer 44 is a diffusion barrier essential to the invention and serves a purpose earlier explained in this patent specification. FIG. 3g represents a fabrication stage that must pre-exist the stage when contact structure 40 is alloyed to the prepared p InP surface material and the TiW layer 44 serves its purpose during the alloying.

Next, widely-spaced-apart, laterally-separated nitride layer portions are removed, using a conventional technique, from InP surface 14a. Then a contact pattern of AuGe/Au multilayer metallization is formed over thus uncovered substrate surface regions to provide source and drain contact metallization at positions where nitride material has just been removed. A 1000-A AuGe source-drain contact pattern is first deposited in intimate contact with the respective n+ source and drain regions (24,26) via standard techniques of photoresist masking and nitride etching followed by coevaporation of Au and Ge onto desired contact areas to form a AuGe layer 50. A 1000-A Au contact pattern 52 is next deposited over AuGe layer 50. A multilayered source contact 60 and a multilayered drain contact 62, best shown in FIG. 7, are thus established. Thus, AuGe/Au source and drain contacts, as shown in FIG. 3h, are provided prior to a critical alloying step that serves to alloy the gate contact to subjacent pInP material in accordance with our invention.

Next, the multilayer gate contact 40, the source contact 60, and the drain contact 62 are alloyed simultaneously, at 400° C. for 30 seconds in flowing forming gas, to the underlying substrate 14, as schematically indicated by FIG. 3i.

The resultant basic InP JFET structure, best shown in FIG. 7, embodies AuZn, TiW and Au material in an improved alloyed gate contact to subjacent p InP with the essential feature of a TiW diffusing barrier layer between an underlying layer AuZn and an overlaying metal layer of Au.

Gate metal resistance measurements taken on sample 2 micron by 260 micron gate test structures following an alloying step performed at 400° C. for 1 minute gave the following test results.

| Sample #1 | |
|---|---|
| 250 A AuZn/10,000 A Au | |
| Before alloy | 6.3 ohms |
| After alloy | 18.0 ohms |
| % Change | about 180% |

| Sample #2 | |
|---|---|
| 250 A AuZn/500 A TiW/10,000 A Au | |
| Before alloy | 5.8 ohms |
| After alloy | 6.8 ohms |
| % Change | about 17% |

Next, a multilayer metallization 64 of Cr and Au layers is formed on parts of contact 60 and 62, to provide a 50-A Cr layer and an 8000-A Au layer upon a portion of source contact 60 and a portion of drain contact 62. The Cr-Au deposited on contacts 60 and 62 reduce the source-drain metal resistance. FIG. 3j shows the resulting structure.

Next, the patterned nitride layer 34 is completely etched away to bare two laterally separate surface areas of the p+ gate region 32 plus part of the drain region surface area that is nearest the gate region 32. Then a thin 200-A Au film 70 is defined on the bare surface portion of drain region 26 to cover a previously exposed drain ledge devoid of nitride material. Since Au film 70 overlies a portion of n+ region 26 closest to gate region 32, it will serve to prevent removal of n+ InP material from this near-to-source region drain portion when InP material is next etched out from respective portions of p+ gate region 28.

Etching is next accomplished FIG. 3j illustrates the resulting structure when InP etching is completed.

During said etch step an exposed portion of the p+ region 28 centered about gate contact 40 is $Cl_2$ plasma etched until the reverse gate-source I-V characteristic shows low leakage current and sharp breakdown. Etching accomplishes removal of p+ InP material down to the subjacent n layer 20 and produces a 1 micron by 300 micron island 32a of p+ InP material defining a gate JFET region 80 with an overlaying gate contact 40 areawise coextensive.

Finally, thin Au film 70 is chemically removed and a completely fabricated InP JFET device is obtained has proportions accurately drawn to scale in FIG. 2, and the essential TiW contact layer 44 best shown in FIG. 7.

JFET PERFORMANCE

Figure 5:
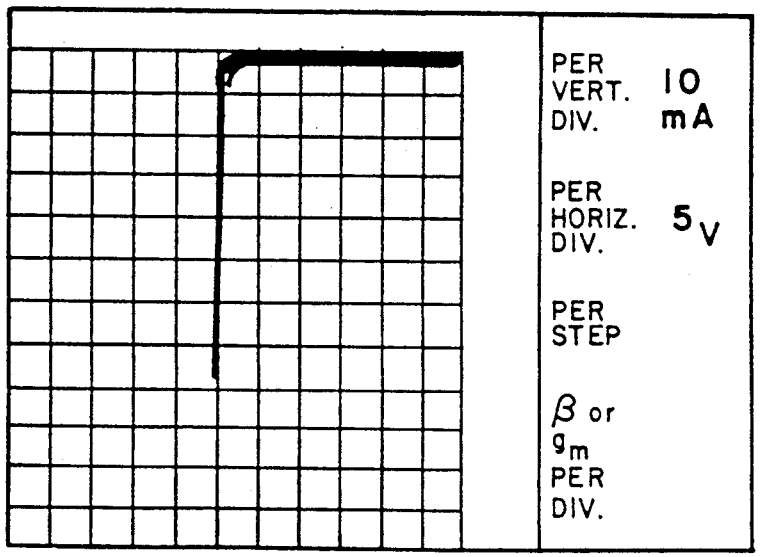
FIG. 5 illustrates an InP JFET gate-source reverse I-V characteristic.
Figure 6:
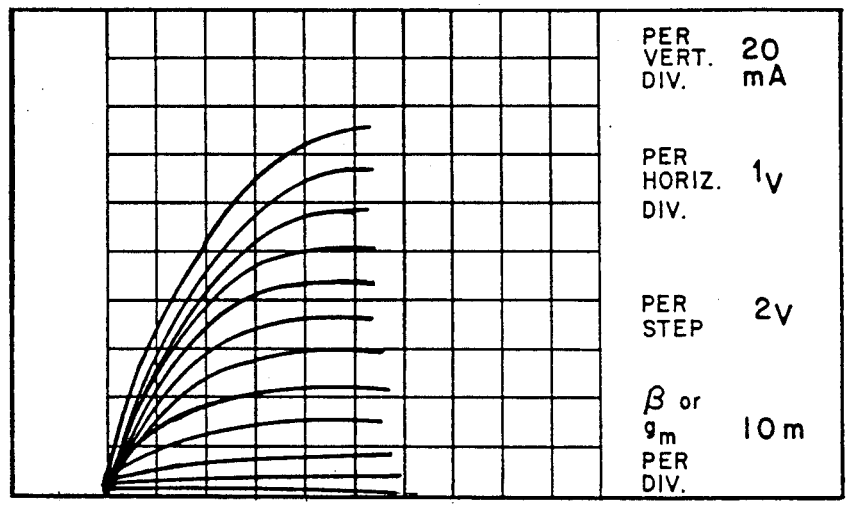
FIG. 6 illustrates an InP JFET I-V drain characteristic.

The gate-source diode reverse I-V characteristic is shown in FIG. 5. The reverse breakdown at 10 microamps was typically 25 V and the diodes shows 0.9-V forward turn-on voltages. A typical FET I-V drain characteristic for the completed devices is shown in FIG. 6. The implanted JFET exhibits minimal hysteresis and well-controlled pinchoff behavior. Across the slice, scaled transconductances varied from 30- to 40- mS/mm gate width. The variation in $I_{DSS}$ was 140 to 180 mA and the drain current typically saturated at a drain voltage between 4 and 5 V. The Be-implanted JFET transconductance is lower than the 80-100- mS/mm transconductance observed for 2-3 micron gate length Zn-diffused devices previously reported elsewhere. Conversely, the 14-16 V gate-source diode breakdown voltages of the Zn-diffused JFETs are lower than those of the Be-implanted devices ( 25 V). The n channel implantation and anneal parameters were kept constant for both approaches.

The power and small signal microwave performance of the implanted JFETs were evaluated at 4.5 and 8.0 GHz. For these measurements, the devices were lapped to 4 mils. scribed and bonded into 50-52 microstrip test carriers. The chip carriers were mounted on a copper fixture which was heat sunk by flowing water. Input and output tuning was optimized by twin sleeve coaxial turners With 0-dBm input drive, maximum insertion gains as high as 13.1 and 9.4 dB were measured at 4.5 and 8.0 GHz respectively. The typical bias setting for small-signal operation was a gate voltage of 4 V and a drain voltage of 8 V. The devices were also tested for their maximum saturated power output with 3.0dB gain.

For this measurement, the devices were tuned for maximum power output after each change of input drive level or drain voltage. The gate was typically biased to achieve a drain current of $I_{DSS}/2$. At this bias condition, the devices exhibited source-to-drain burnout voltages as high as 14.5 V. With a 14.5 V drain bias, maximum output powers of up to 300 mW were measured at 4.5 GHz corresponding to a scaled maximum output power of 1 W/mm. At 8.0 GHz scaled output powers as high as 0.66 W/mm were obtained.

An InP JFET generally similar to the one shown in FIG. 7 herein but lacking a TiW diffusion barrier layer in its gate contact is shown in related U.S. Pat. Application Ser. No. 471,096 by J. B. Boos filed on 1March 1983. In contrast thereto we employ a sputtered titanium-tungsten (TiW) layer deposited between the AuZn and the Au layers that acts as a barrier to the Zn out-diffusion. Increasing the Au overlay thickness then effectively reduces the gate metal resistance.

Information relating to the subject matter of this patent specification is set forth in an article entitled, "Planar Fully Ion Implanted InP Power junction FET's," by J. B. Boos et al., appearing on pages 273 through 276 in IEEE Electron Device Letters, Vol. EDL-5, No. 7, July 1984. We hereby incorporate by reference this article into the instant patent specification. FIGS. 1 through 6 of our patent specification and much of the discussion relating thereto is drawn from this article.

Further information relating to the subject matter of this patent specification is set forth in an article entitled, "Planar, Fully Ion Planted Indium Phosphide Junction Field Effect Transistors," by J. B. Boos et al., appearing on pages 194 and 195 of the Naval Research Laboratory 1983 Review published via distribution subsequent to Jan. 1985. We hereby incorporate by reference this article into the instant patent specification. FIG. 7 of our patent specification and much of the discussion relating thereto is drawn from this article.

Obviously many modifications and variations of the present invention are possible in light of the above teachings. It is therefore to be understood that within the scope of the appended claims the invention may be practiced otherwise than is specifically described.

What is claimed and desired to be secured by letters patent of the United States is:

1. A process for fabricating an Indium-Phosphide semiconductor device comprising the steps of:
    forming a prepared major surface on an Indium-Phosphide substrate of a semi-insulating material with an active region of n type semiconductivity within the substrate below the surface and with a surface region of p type semiconductivity within the substrate extending from the major surface and forming a p-n junction with the active region of n type semiconductivity; and
    fabricating a layered ohmic contact on at least a portion of the surface region of p type semiconductivity by the process comprising the steps of:
    depositing a layer of Gold-Zinc alloy contiguous with the portion of the major surface by co-evaporation of Gold and Zinc from separate sources;
    depositing a layer of Titanium-Tungsten alloy contiguous with the layer of Gold-Zinc alloy;
    depositing layer of metal contiguous with the layer to Titanium-Tungsten alloy; and
    attaching the contact to at least a portion of the major surface.

2. A process for fabricating an Indium-Phosphide semiconductor device as recited in claim 1 wherein the prepared major surface is formed on an Indium-Phosphide substrate of a semi-insulating material with a channel region of n type semiconductivity within the substrate below the surface, a surface gate region of p type semiconductivity within the substrate extending from the major surface and forming a p-n gate-channel junction with the channel region of n type semiconductivity and source and drain regions of n+ type semiconductivity in the Indium Phosphide substrate with the channel region extending between them so that the channel, source, drain and gate regions form a JFET structure.

3. An Indium-Phosphide semiconductor device as set forth in claim 2 wherein the contact is attached by alloying at a temperature about 400° C. for at least 30 seconds.

* * * * *